(12) United States Patent
Richter et al.

(10) Patent No.: US 11,897,024 B2
(45) Date of Patent: Feb. 13, 2024

(54) STRUCTURE AND MECHANISM FOR ELECTRICALLY-CONNECTING AN EXTERNAL-CONDUCTOR

(71) Applicant: Panasonic Intellectual Property Management Co., Ltd., Osaka (JP)

(72) Inventors: Max Richter, Hamburg (DE); Olaf Bartz, Adendorf (DE)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 299 days.

(21) Appl. No.: 17/602,734

(22) PCT Filed: Mar. 17, 2020

(86) PCT No.: PCT/JP2020/011630
§ 371 (c)(1),
(2) Date: Oct. 8, 2021

(87) PCT Pub. No.: WO2020/240997
PCT Pub. Date: Dec. 3, 2020

(65) Prior Publication Data
US 2022/0168802 A1 Jun. 2, 2022

(30) Foreign Application Priority Data
May 31, 2019 (EP) .................................. 19177557

(51) Int. Cl.
*H05K 1/02* (2006.01)
*B21K 1/62* (2006.01)
(Continued)

(52) U.S. Cl.
CPC .............. *B21K 1/62* (2013.01); *B21J 15/027* (2013.01); *B23K 20/1295* (2013.01);
(Continued)

(58) Field of Classification Search
CPC .......... H05K 2201/10272; H05K 2201/10409; H05K 1/0263; H05K 3/4015
See application file for complete search history.

(56) References Cited

U.S. PATENT DOCUMENTS 5,263,247 A * 11/1993 Adachi ................ H01R 43/205
29/525.05
5,381,598 A * 1/1995 Adachi .................... H01R 9/20
29/843

(Continued)

Primary Examiner — Sherman Ng
(74) Attorney, Agent, or Firm — Rimon P.C.

(57) ABSTRACT

The present disclosure relates to a structure for electrically-connecting an external conductor. The structure comprises a wiring-substrate comprising a stack based arrangement of a plurality of layers, wherein said layers are defined as electrically conducting layers and insulating layer. A rivet is supported from the wiring substrate and comprises an embedded portion within the wiring substrate. The embedded portion comprises: an upper section extending through the stack of the plurality of layers, and, a bottom section extending laterally with reference to the upper section. A portion protruding from wiring substrate is provided for receiving an external-conductor and for thereby electrically connecting with the wiring substrate.

16 Claims, 10 Drawing Sheets

(51) Int. Cl.
    *B21J 15/02*     (2006.01)
    *B23K 20/12*     (2006.01)
    *H05K 1/05*     (2006.01)
    *H05K 3/32*     (2006.01)
    *H05K 3/40*     (2006.01)
    *B23K 101/36*     (2006.01)

(52) U.S. Cl.
    CPC ............ *H05K 1/0263* (2013.01); *H05K 1/05* (2013.01); *H05K 3/32* (2013.01); *H05K 3/4015* (2013.01); *B23K 2101/36* (2018.08); *H05K 2201/10272* (2013.01); *H05K 2201/10409* (2013.01)

(56) References Cited

U.S. PATENT DOCUMENTS

2003/0067754 A1*   4/2003   Bauer .................... H05K 7/205
    361/760
2014/0347819 A1*  11/2014   Ott ...................... F16H 61/0003
    361/728

\* cited by examiner

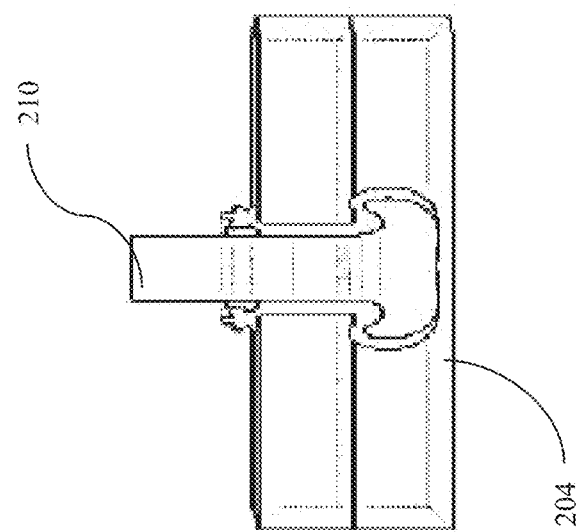
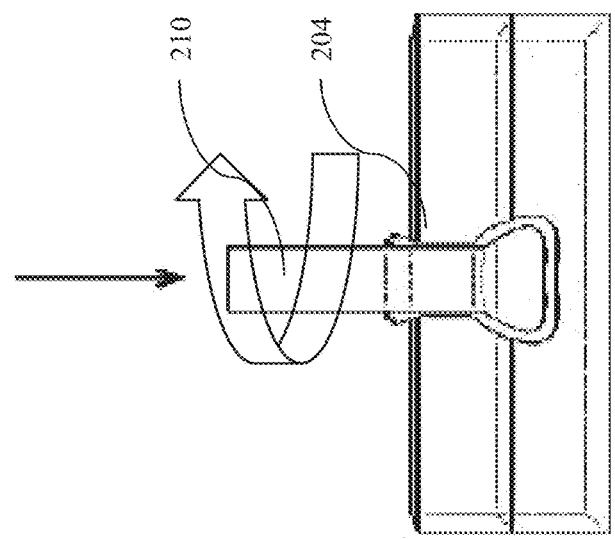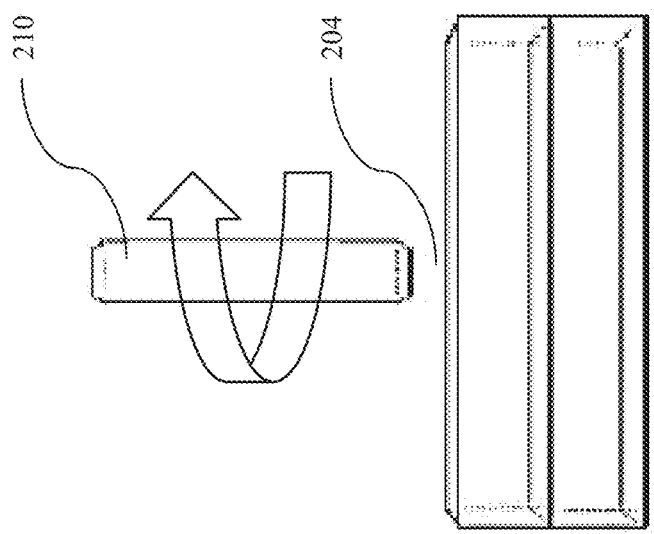
FIG. 6C
FIG. 6B
FIG. 6A

STRUCTURE AND MECHANISM FOR ELECTRICALLY-CONNECTING AN EXTERNAL-CONDUCTOR

CROSS-REFERENCE OF RELATED APPLICATIONS

This application is the U.S. National Phase under 35 U.S.C. § 371 of International Patent Application No. PCT/JP2020/011630, filed on Mar. 17, 2020, which in turn claims the benefit of European Application No. 19177557.6, filed on May 31, 2019, the entire disclosures of which Applications are incorporated by reference herein.

TECHNICAL FIELD

The present subject matter relates to power-electronics and in particular to connection-structures therein.

BACKGROUND ART

External conductors such as bus bar or power transmitting cables are known to be interfaced with wiring substrates such as a PCB (i.e. Printed Circuit Board) for electrically connecting with distant-devices. The bus-bar transmits the power from the PCB to distant device and vice versa and accordingly connects with the current-conductive tracks, pads within the wiring-substrate.

As may be known, owing to enormity of structure and weight, the external conductors such as bus-bars are not directly connected or mounted upon PCB. Existing mechanisms to achieve current-connection between the external-conductors and the PCB include usage of press fit contacts or press-fit connectors, which provide an interface between the PCB and the external conductors.

Such connectors connect electrically and mechanically with PCB via a through-bore within the PCB. However, instead of resorting to the soldering technique that is a prominent mechanism for connection components at the PCB, the connectors connect through a press-fit connection with PCB.

An example press-fit connector for external-conductors and mountable on PCB has been depicted with respect to FIG. 1A, wherein the press-fit connector may be a screw-nut or bolt acting both as a fastener as well as an electrical-socket for receiving the external conductor such as bus-bar or power cable. Further, FIG. 1B illustrates the external conductor in an electrically connected and fastened position through the nut-bolt based press-fit connectors.

However, such press-fit based connectors for the external conductors have their own share of disadvantages. To name a few, during pressing these contacts into the PCB, the area around the PCB is subjected to a significant stress and in long run leads to development of strain within the PCB. Subsequent slackening of the connection may occur as a result of creep, moisture and relaxation of the PCB.

Additionally, during the process of press-fitting, conductive burrs are prone to be produced from the PCB, thereby interfering with conduction within the current conducting pathways in the PCB. In an example, although the conductive burrs as produced do not intrude into the PCB, yet they tend to interfere with the conductive pathways or conductive-traces on the surface of PCB. Accordingly, for example, the burrs may lead to resistance or blockage therein. In the worst case scenario, the PCB may also get subjected to electrical-hazards such as short-circuit, thereby endangering life and property.

For avoiding such mobility of conductive burrs on the PCB, an additional cleaning has to be undertaken, thereby leading to additional overhead and costs. Furthermore, the through-bore arrangement as necessitated by the press-fit connections necessitates a provision of insulation at the bottom of the PCB owing to exposed conductor-elements.

While other connection mechanisms such as soldered-connections may be envisaged as an alternate connection-mechanism in an attempt to prevent the aforesaid drawbacks, such type of connections are usually not recommended for external-conductors such as bus-bars owing to lack of sustainability with the soldered connections. Further, the fact remains that post-soldering, the soldered connections require additional-step of the verification of joining quality. Moreover, many a times, an insulation layer is required beneath the soldered joints to insulate the soldered joints from each other. Accordingly, there remains an overhead associated with the soldering process.

Accordingly, there lies at-least a need to render reliable and improved connection-structures for connecting external-conductors with the PCB.

There lies at-least another need to render cost-effective, and easy-to-use connection-structures for connecting external conductors with the PCB.

SUMMARY OF INVENTION

This summary is provided to introduce a selection of concepts in a simplified format that is further described in the detailed description of the present disclosure. This summary is neither intended to identify key inventive concepts of the disclosure nor is it intended for determining the scope of the invention or disclosure.

In an embodiment, the present subject matter illustrates a structure for electrically-connecting an external conductor. The structure comprises a wiring-substrate comprising a stack based arrangement of a plurality of layers, wherein said layers are defined as electrically conducting layers and insulating layer. A rivet is supported from the wiring substrate and comprises an embedded portion within the wiring substrate. The embedded portion comprises: an upper section extending through the stack of the plurality of layers, and, a bottom section extending laterally with reference to the upper section. A portion of the rivet protruding from wiring substrate is provided for receiving an external-conductor and for thereby electrically connecting with the wiring substrate.

In another embodiment, the present subject matter illustrates a structure for electrically-connecting an external conductor. The structure comprises a wiring-substrate comprising a stack based arrangement of a plurality of layers, said layers defined by electrically conducting layer and insulating layers. At least one rivet embedded within the wiring substrate comprises an upper section extending through the stack of the plurality of layers, and a bottom section extending laterally within the wiring substrate with reference to the upper section. Further, a metallic-post vertically extends from the upper-section of the rivet for receiving an external conductor and thereby electrically-connects the conductor with the wiring substrate via the rivet.

The objects and advantages of the embodiments will be realized and achieved at-least by the elements, features, and combinations particularly pointed out in the claims. It is to be understood that both the foregoing general description and the following detailed description are representative and explanatory and are not restrictive of the invention, as claimed.

BRIEF DESCRIPTION OF DRAWINGS

These and other features, aspects, and advantages of the present disclosure will become better understood when the following detailed description is read with reference to the accompanying drawings in which like characters represent like parts throughout the drawings, wherein:

FIG. 6A illustrates an example friction-riveting process for achieving the connection-structure, in accordance with another embodiment of the present subject matter;

FIG. 6B illustrates an example friction-riveting process for achieving the connection-structure, in accordance with another embodiment of the present subject matter:

FIG. 6C illustrates an example friction-riveting process for achieving the connection-structure, in accordance with another embodiment of the present subject matter;

Figure 1A:
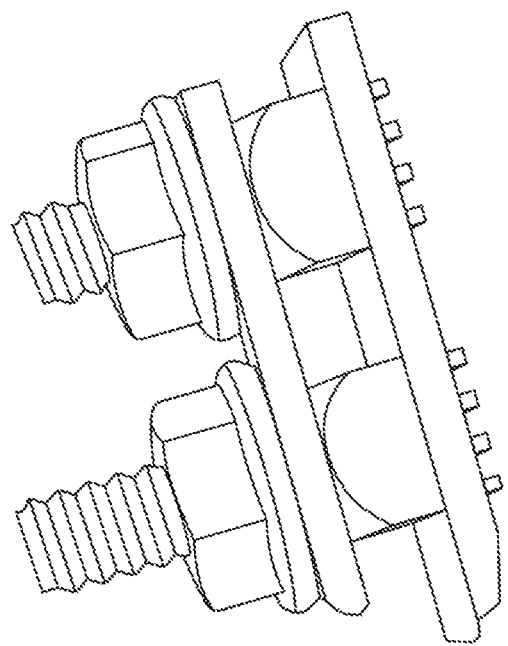
FIG. 1A illustrates a prior art connection structure for external-conductors with respect to a wiring substrate.
Figure 1B:
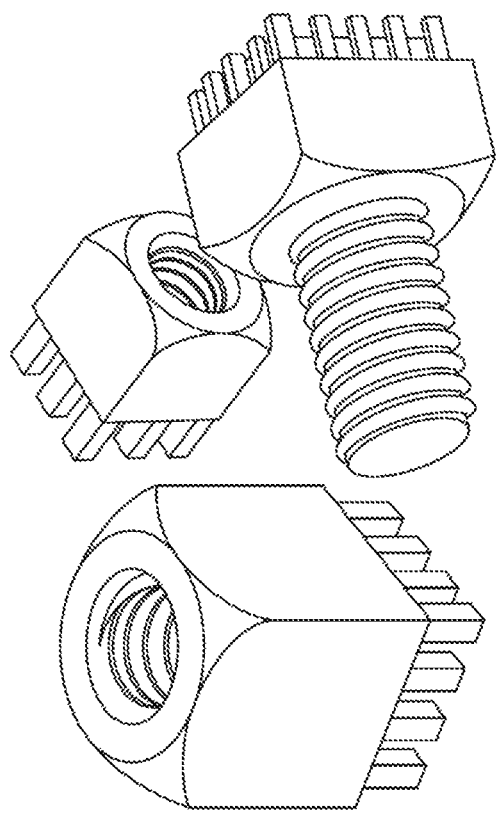
FIG. 1B illustrates the prior art connection structure for external-conductors with respect to a wiring substrate.

The elements in the drawings are illustrated for simplicity and may not have been necessarily been drawn to scale. Furthermore, in terms of the construction of the device, one or more components of the device may have been represented in the drawings by conventional symbols, and the drawings may show only those specific details that are pertinent to understanding the embodiments of the present disclosure so as not to obscure the drawings with details that will be readily apparent to those of ordinary skill in the art having benefit of the description herein.

DESCRIPTION OF EMBODIMENTS

For the purpose of promoting an understanding of the principles of the present disclosure, reference will now be made to the embodiment illustrated in the drawings and specific language will be used to describe the same. It will be understood that no limitation of the scope of the present disclosure is thereby intended, such alterations and further modifications in the illustrated system, and such further applications of the principles of the present disclosure as illustrated therein being contemplated as would normally occur to one skilled in the art to which the present disclosure relates.

The foregoing general description and the following detailed description are explanatory of the present disclosure and are not intended to be restrictive thereof.

Reference throughout this specification to "an aspect", "another aspect" or similar language means that a particular feature, structure, or characteristic described in connection with the embodiment is included in at least one embodiment of the present disclosure. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or subsystems or elements or structures or components proceeded by "comprises . . . a" does not, without more constraints, preclude the existence of other devices or other subsystems or other elements or other structures or other components or additional devices or additional subsystems or additional elements or additional structures or additional components.

Unless otherwise defined, all technical and scientific terms used herein have the same meaning as commonly understood by one of ordinary skill in the art to which this present disclosure belongs. The system, methods, and examples provided herein are illustrative only and not intended to be limiting.

Figure 2:
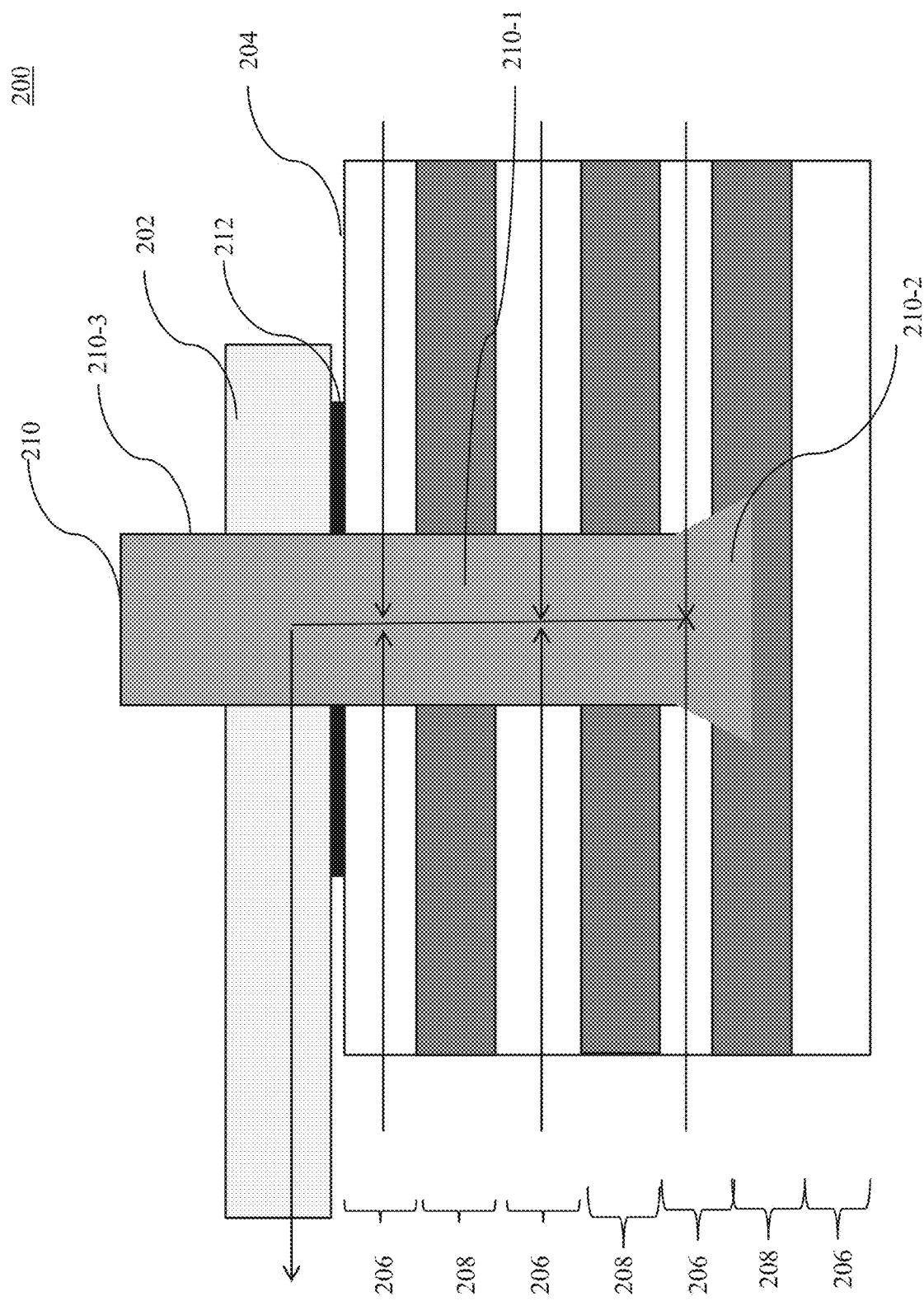
FIG. 2 illustrates a connection structure for external-conductors with respect to a wiring substrate, in accordance with an embodiment of the present subject matter.

FIG. 2 describes a structure 200 for electrically-connecting an external-conductor 202. Said external conductor 202 may be a high-current carrying conductor comprising at-least one of which may be a bus bar shaped to be coupled or connected with a terminal. In an example, as later shown in FIG. 3, the bus bar may be shaped to exhibit a through-bore for such connections. In other example, the conductor 202 may be power-cable having a crimp-connector.

The structure 200 comprises a wiring-substrate 204 comprising a stack based arrangement of a plurality of layers, said layers defined as electrically conducting layers 206 and insulating layer 208. In an example, the wiring substrate 204 is a printed circuit substrate (PCB) composed of a pattern of dielectric-layers 208 and copper layers 206.

A rivet 210 supported from the wiring-substrate 204 comprises an embedded portion within the wiring substrate 204. The embedded-portion comprises an upper section 210-1 extending through the stack of the plurality of layers. A bottom-section 210-2 extends laterally with reference to the upper section 210-1. The bottom section 210-2 is embedded within the insulating layer 208 of the wiring substrate 204, such that the insulating-layer 208 corresponds to a non-conducting substrate of the PCB.

Further, the rivet 210 comprises a portion 210-3 protruding from the wiring-substrate 204 for receiving an external-conductor 202 and thereby electrically connecting with the wiring substrate 204. The protruding portion 210-3 of the rivet 210 acts as a terminal-post to connect the external-conductors 202 with the wiring substrate 204.

The arrows in the figure indicate an example flow of current from the conducting layer 206 (i.e. conducting traces) of the PCB, through the rivet 210, and reaching the external-conductor. However, the current flow in opposite-direction is also feasible through the PCB. The rivet 210 may be grounded within the non-conducting or insulating layer 208 of the wiring-substrate 204. In addition, a washer based arrangement 212 may be provided between the external conductor 202 and the wiring substrate 204 for load-distribution.

Figure 3:
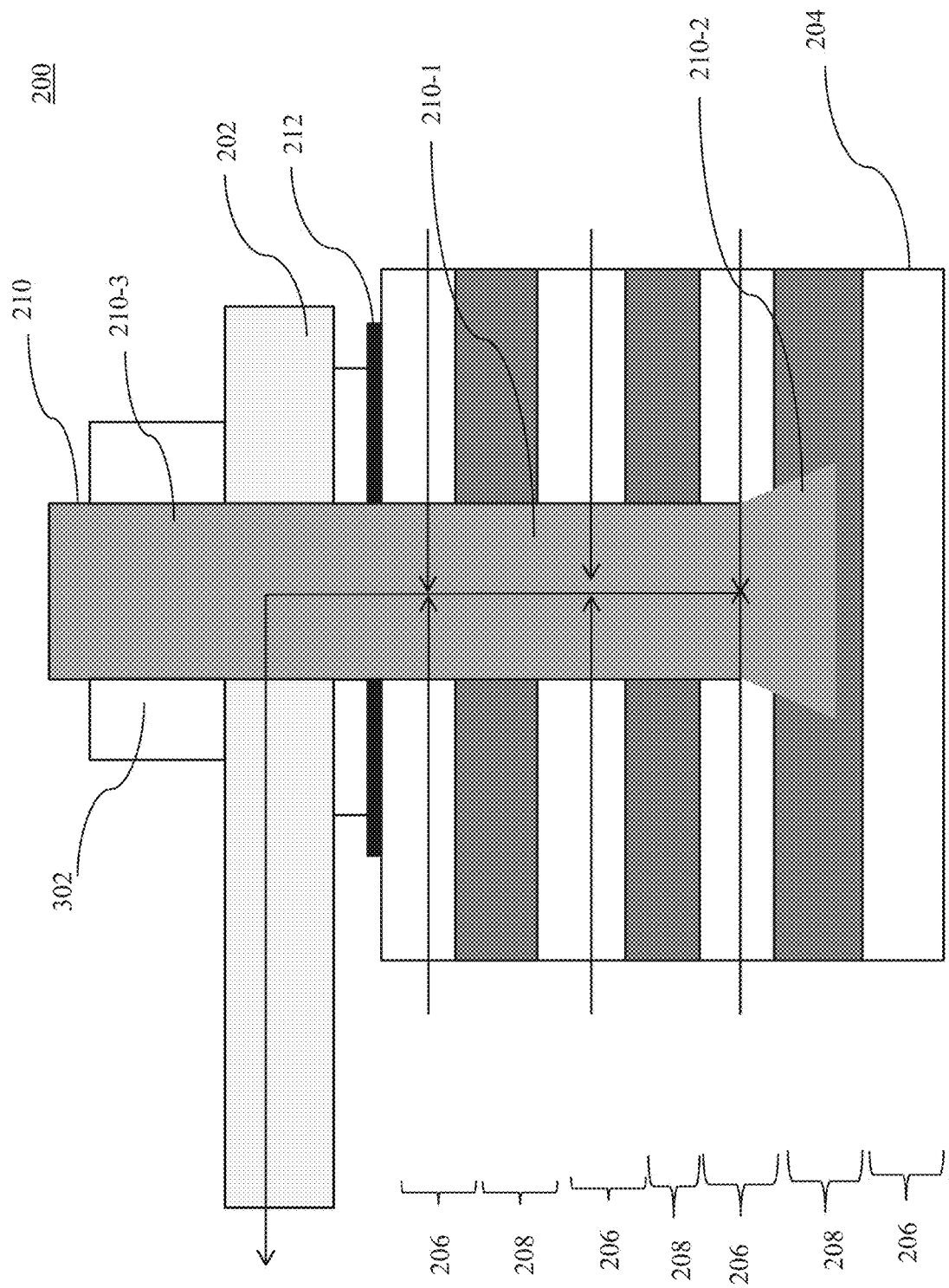
FIG. 3 illustrates an example connection structure for external-conductors with respect to the PCB, in accordance with an embodiment of the present subject matter.

FIG. 3 illustrates an example connection structure 200 for external-conductors with respect to the PCB 204, in accordance with an embodiment of the present subject matter. As indicated in the figure, a fastener 302 is provided for rigidly holding the external-conductor 202 to the protruding portion 210-3 of the rivet 210. In the present implementation, the external-conductor 202 comprises a through-bore to receive the rivet 210. The fastener 302 may a screw based nut wound around the rivet 210 atop the external conductor 202. The rivet 210 in turn may be threaded to receive the nut and thereby rigidly support the external conductor 202.

Figure 4:
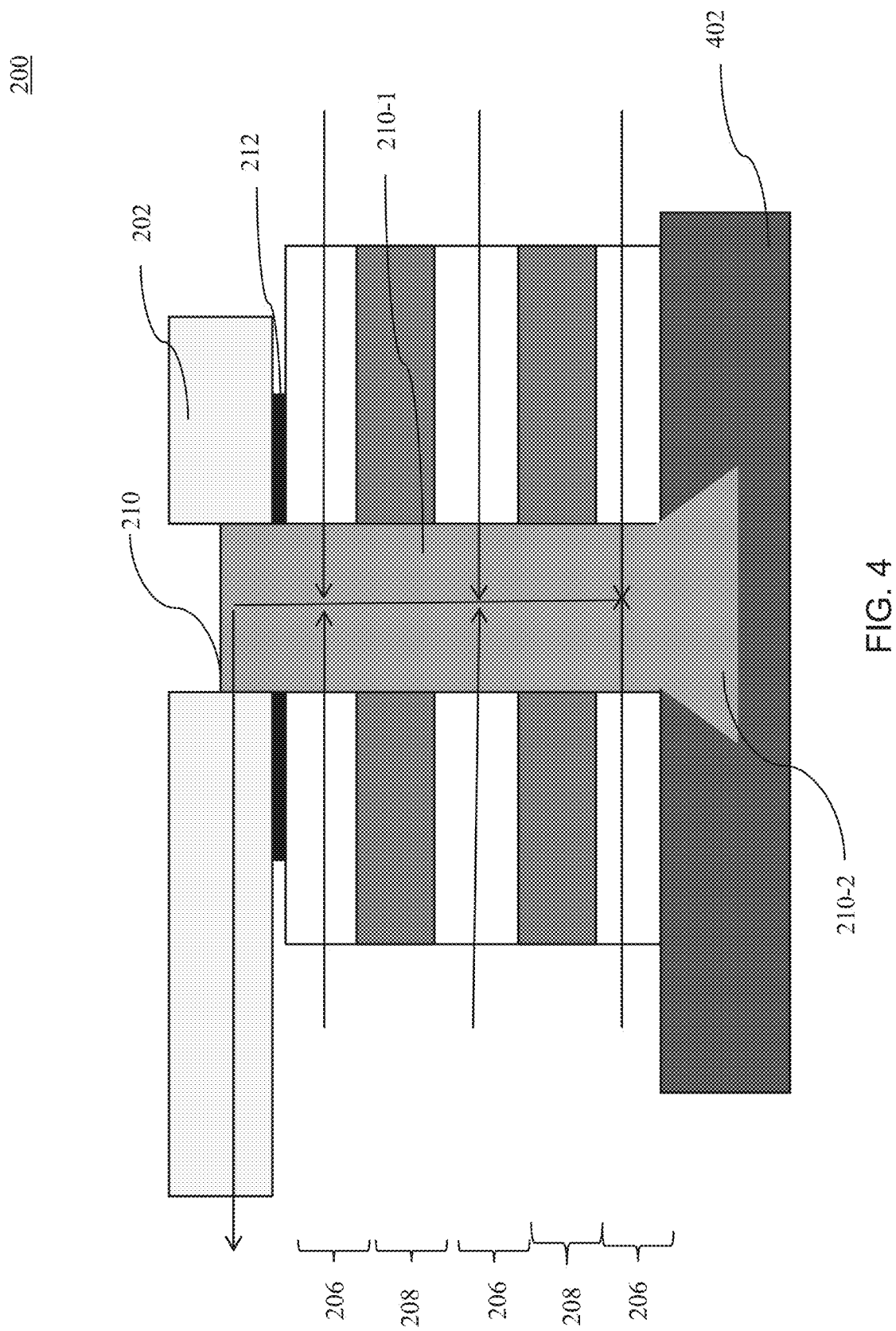
FIG. 4 illustrates another example connection structure for external-conductors with respect to the PCB, in accordance with an embodiment of the present subject matter.

FIG. 4 illustrates another example connection structure 200 for external-conductors with respect to the PCB, in accordance with an embodiment of the present subject matter. More specifically, the present connection structure 200 comprises a supporting-substrate 402 providing a base for supporting the wiring substrate 204 or the PCB. In such a scenario, the supporting substrate 402 receives the bottom-section 210-2 of the rivet 210 for assisting the embedding of the rivet 210 within the wiring substrate 204.

Figure 5:
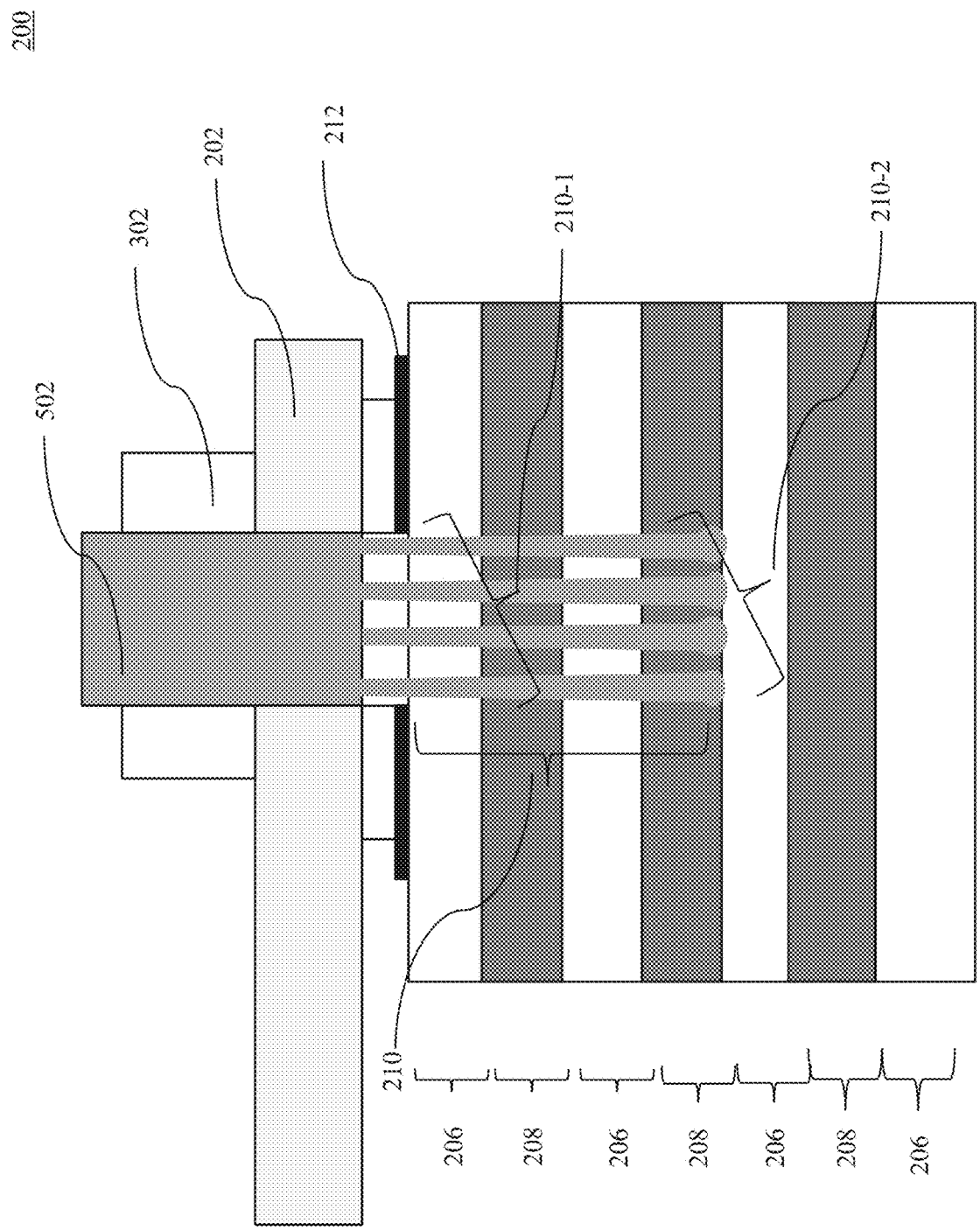
FIG. 5 illustrates another example connection structure for external-conductors with respect to the PCB, in accordance with an embodiment of the present subject matter.

FIG. 5 illustrates another example connection structure for external-conductors with respect to the PCB 204, in accordance with an embodiment of the present subject matter. More specifically, the present structure 200 for electrically-connecting an external conductor 202 comprises the wiring-substrate 204 as illustrated in preceding figures. The stack-based arrangement of a plurality of layers, said layers defined by electrically-conducting layer 206 and insulating layers 208.

The rivet 210 is embedded within the wiring-substrate 204 and comprises an upper-section 210-1 extending through the stack of the plurality of layers. A bottom section 210-2 extends laterally within the wiring substrate 204 with reference to the upper-section 210-1.

A metallic-post 502 vertically extends from the upper-section of the rivet 210 for receiving an external conductor 202 and thereby electrically connects the conductor 202 with the wiring substrate via the rivet 210.

The metallic post 502 is vertically connected to a segment of the rivet 210 protruding from the wiring substrate 204 to define an electrical-connection with the rivet 210, wherein said connection may be either a welded or soldered connection. In other example, the metallic post 502 is vertically connected to a segment of the rivet 210 sitting flush with the wiring substrate 204 to define an electrical connection with the rivet 210, wherein said connection is at least one of a welded or soldered connection. The bottom section of the rivet 210 may be embedded within the insulating-layer of the wiring substrate 204.

FIGS. 6A-6C illustrate an example friction-riveting process for achieving the connection-structure of FIG. 2, in accordance with another embodiment of the present subject matter.

As depicted in FIG. 6A, the rivet 210 is set up for connecting with the wiring substrate 204, which may be hereinafter referred as work-piece. The rivet 210 is set in-rotation in clockwise-direction as indicated by the arrow As depicted in FIG. 6B, the rivet 210 is lowered in the direction of arrow onto the workpiece 204 and is pressed into the latter. As a result of the rotation of the rivet 210, a thin region of the workpiece 204 around the work piece 210 is plasticized.

As depicted in FIG. 6C, if the rivet 210 is pressed further into the workpiece 204 the temperature rises in the rivet 210 due to friction and pressure becomes high. The rotational-speed of the rivet 210 in this case is between 15000 and 23000 rev/min, and the pressure with which the rivet 210 is pressed against the PCB 204 is between 2 and 10 bar, so that the joining-time for the connection was between 0.3 and 3 seconds.

This causes a scenario such that the rivet 210 and in particular its bottom portion is plasticized, since the heat energy supplied by friction is greater than the heat flowing off via the rivet 210. As a result of the plasticization, the bottom portion 210-2 of the rivet 210 is arched in such a way that the bottom portion 210-2 extends laterally within the substrate 204 and accordingly a diameter of said 'arched' bottom portion is developed as greater than the diameter of that remaining section (i.e. the protruding portion 210-3 and the upper portion 210-1) of the rivet 210.

When the rotation of the rivet 210 is stopped, the plasticized material of the work-piece 204 around the rivet 210 cures and the arched point remains in this form, so that a positive-locking connection between the workpiece 204 and the rivet 210 has been formed. The rivet 210 is thus firmly anchored in the workpiece 204.

Overall, the bottom section 210-2 is anchored within the wiring substrate 204 in a positive-locking manner. The bottom section 210-2 of the rivet 210 is laterally extended with respect to the upper section 210-1 owing to plasticization and deformation underwent by the bottom section during the friction riveting process. The laterally extended bottom section corresponds to an arched configuration defining a diameter, said diameter of arched configuration being greater than a diameter of the upper section.

In this example embodiment, it is also not only possible for the first workpiece 204 to be connected to the rivet 210, but also a second-workpiece 302 acting as the supporting substrate 302 can be arranged beneath the surface of the first workpiece 204. The rivet 210 can then be pressed in a rotational manner into the workpiece 204, so that the rivet 210 is then connected to both of the work-pieces 204 and 304, and eventually the supporting substrate 304 receives the bottom portion of the rivet 210.

Figure 7:
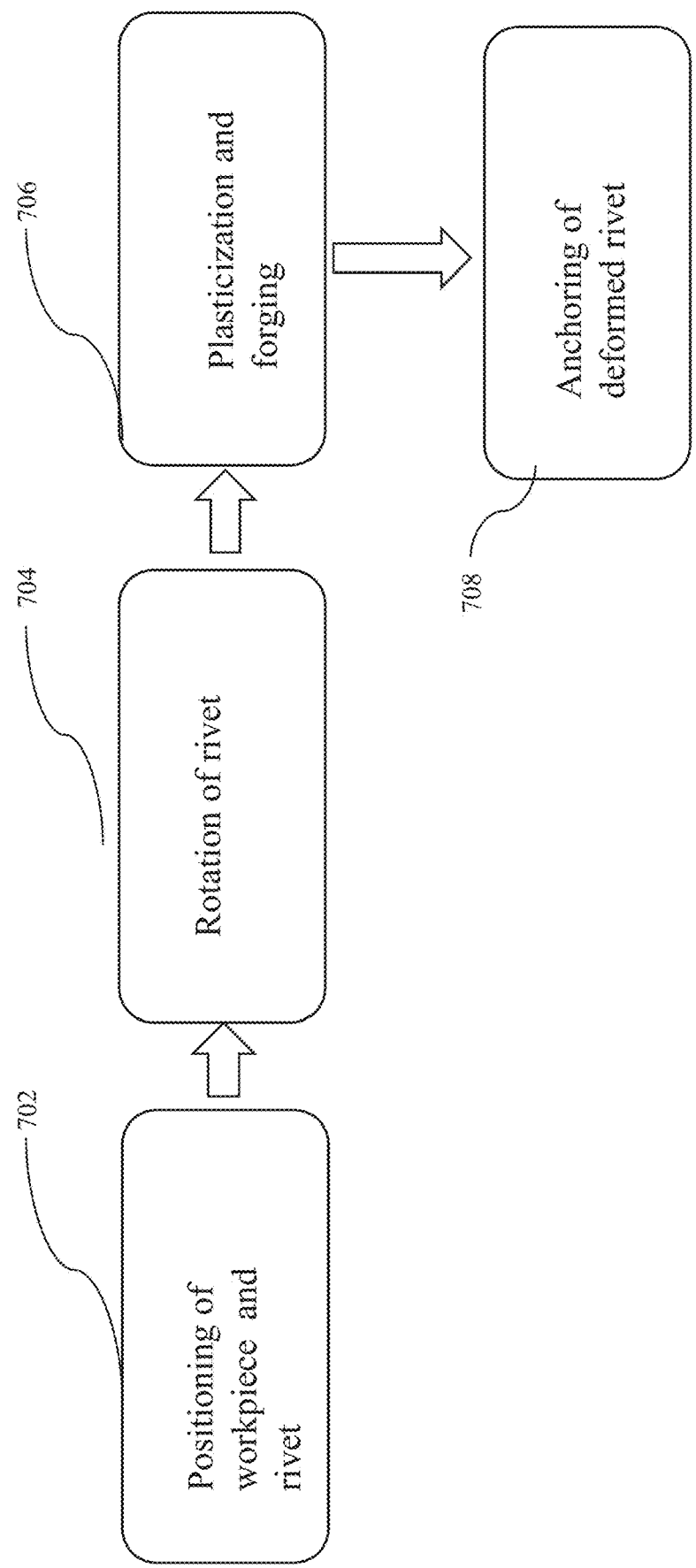
FIG. 7 illustrates an example flow-chart elaborating the example friction-riveting process of FIGS. 6A-6C, in accordance with another embodiment of the present subject matter.

FIG. 7 illustrates an example flow-chart elaborating the example friction-riveting process of FIGS. 6A-6C, in accordance with another embodiment of the present subject matter.

Step 702 illustrates clamping of the joining partners. The work piece 204 may be firmly clamped onto a backing plate, while the rivet 210 is clamped in a machine-spindle for rotation clockwise. The present step corresponds to FIG. 6A.

Figure 8:
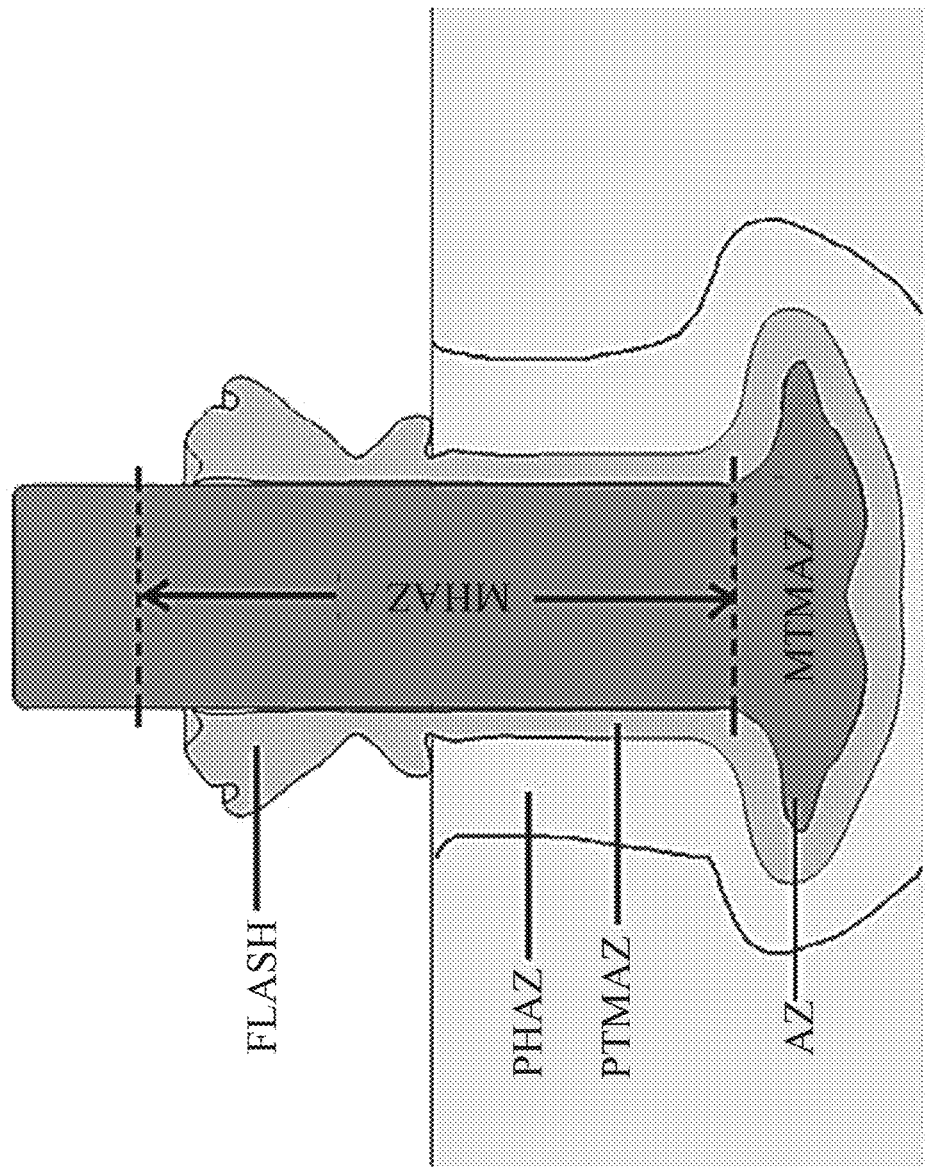
FIG. 8 illustrates an example representation of embedded rivet within the PCB, in accordance with another embodiment of the present subject matter.

Step 704 illustrates rotation of the rivet 210 and corresponds to FIG. 6B. The rotating rivet 210 is moved downwards touching down on the work-piece 204. The rotation combined with pressure generates frictional-heat, thereby locally increasing the temperature. This in turn leads to the formation of a very thin film of molten polymer underneath and around the tip of the rivet 210. With the continuous feeding of the rivet 210 into the work-piece 204, the molten polymer material as well as a conductive material from work-piece is expelled upwards outside as a flash as indicated in FIG. 8.

Step 706 illustrates a plasticization and forging process. At a certain insertion depth, the heat-input becomes larger than the heat outflow due to increasingly thermal insulation effect associated with the low thermal conductivity of the polymer. This elevates the local-temperature within the work-piece 204, such the bottom portion of the rivet 210 softens. At this point rotation of the rivet 210 is stopped and forging pressure is applied.

The forging phase leads to the formation of arch-shaped portion of the rivet 210 resembling an inverted screw inserted in the polymer. The plasticized tip of the rivet 210 is then deformed leading to the paraboloidal pattern. The thickness of molten polymer is strongly reduced underneath the rivet's tip and a flash volume is increased by the amount of extra squeezed material.

At step 708, a portion of the remaining amount of molten polymeric film is pushed out to flash, whereas the rest stays and cools down inside the joint. After cooling under constant pressure, the joint cools down under constant pressure. The molten polymer consolidates around the rivet 210 creating a bonded polymer-metal interface. In this way, a joint may be obtained by mechanical interference, and a rivet anchoring is achieved.

In an example, friction riveting process parameters are rotation speed (RS), joining time (TT), and joining pressure (TP). Other important parameters may be the rivet geometry and spindle distance to base element surface. RS is the angular velocity of the rotating rivet and may be to the temperature development and associated phenomena (rheology of molten polymer, defect formation, etc.) taking place in the joint region assisting on the friction heating generation. Besides, RS may influence indirectly the joining speed, by directly acting on the axial displacement. TT comprises the sum of the friction time (FT), plus forging time (FOT). Besides being a joining speed control factor, TT may also influence the level of volumetric defects related to thermal degradation, volatiles development and post-joining shrinkage, by controlling the temperature and exposure time in the molten polymeric film. The joining pressure, TP is the addition of the friction pressure (FP) and the forging pressure (FOP).

FIG. 8 illustrates an example representation of embedded rivet 210 within the PCB 204, in accordance with another embodiment of the present subject matter.

Due to the intrinsic structural complexity involving polymer-metal multi-Materials joints, complex microstructures may occur within friction riveting joints. In an example, the present joint between rivet 210 and PCB 204 may exhibit about five microstructural zones: the polymer heat affected zone (PHAZ), the polymer thermo-mechanically affected zone (PTMAZ), the metal heat affected zone (MHAZ), the metal thermo-mechanical affected zone (MTMAZ) and anchoring zone, (AZ).

The PHAZ comprises the polymeric volume around the rivet, whose temperature during joining did not reach the polymer softening point. The PTMAZ is formed by the thin molten layer around the rivet, and it is an interlayer between the PHAZ and the metallic rivet.

In the MHAZ, the metal is heat treated by frictional heat. In this region, different annealing phenomena can take place, e.g. recovering, recrystallization and overaging, as well as some hardening mechanisms such as ageing and re-precipitation, depending on rivet type, heating time and maximum temperature. MTMAZ microstructure and local mechanical properties may be influenced by heating and severe deformation.

The AZ is the zone, where the deformed tip of the rivet 210 is located. Due to plastic deformation it generally assumes a paraboloidal format, whose external diameter is bigger than the original rivet diameter. This region mainly bears the applied mechanical requirement through mechanical interference (anchoring) with the polymeric base element.

Figure 9C:
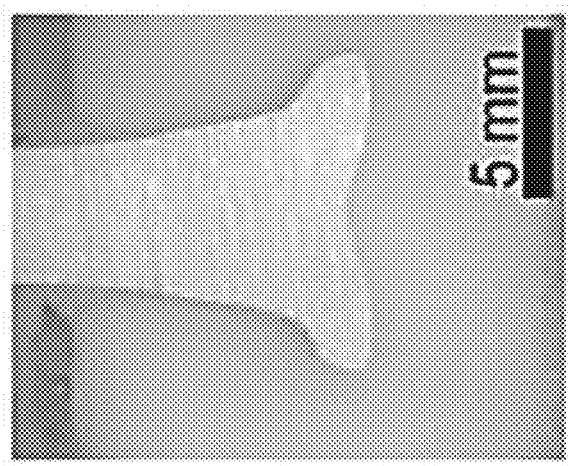
FIG. 9C illustrates an example representation of connection structure within the PCB, in accordance with another embodiment of the present subject matter.
Figure 9B:
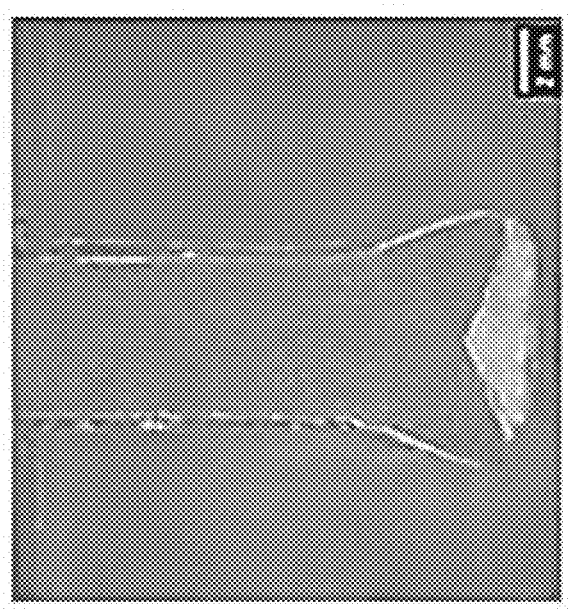
FIG. 9B illustrates an example representation of connection structure within the PCB, in accordance with another embodiment of the present subject matter.
Figure 9A:
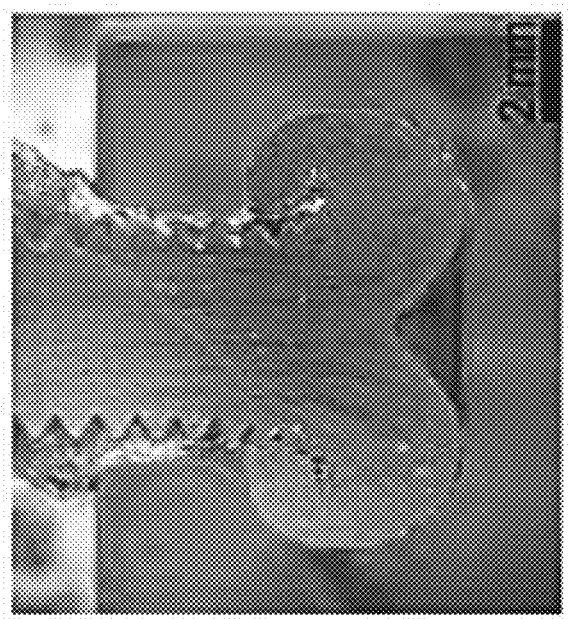
FIG. 9A illustrates an example representation of connection structure within the PCB, in accordance with another embodiment of the present subject matter.

FIGS. 9A-9C illustrate an example representation of connection structure 200, in accordance with another embodiment of the present subject matter. More specifically, the connection structure has been depicted through an SEM image with working distance (WD) ranging from 2 mm to 5 mm and comprises unreinforced polymer based substrate. The connection structures corresponds to following configurations:

TABLE 1

| Figure | Material (Rivet) | Material (substrate) |
| --- | --- | --- |
| FIG. 9A | AA 2024 | PEI |
| FIG. 9B | AA 2024 | PC |
| FIG. 9C | AA 6056 | PA6 |

FIGS. 10A-10D illustrate an example representation of connection structure, in accordance with another embodiment of the present subject matter. More specifically, the connection structure corresponds to an SEM image with working distance (WD) ranging from 2 mm to 5 mm and comprises reinforced polymer (glass filled GF, carbon filled CF) based substrate. The connection structures correspond to following configurations:

TABLE 2

Figure 10A:
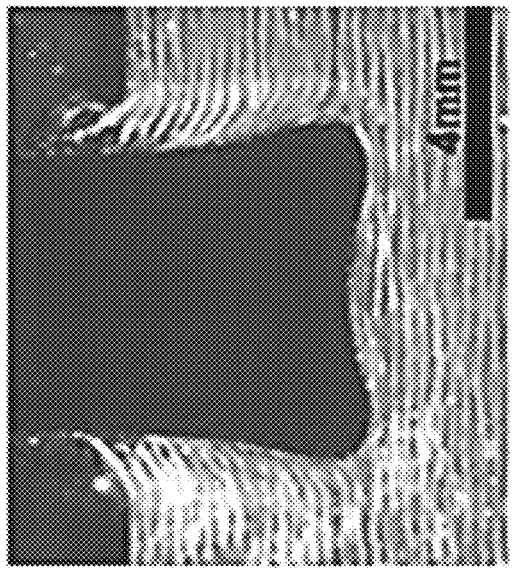
FIG. 10A illustrates another example representation of connection structure within the PCB, in accordance with another embodiment of the present subject matter.
Figure 10B:
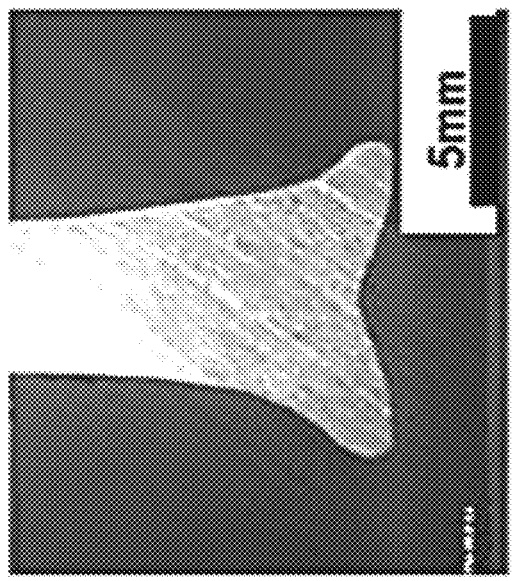
FIG. 10B illustrates another example representation of connection structure within the PCB, in accordance with another embodiment of the present subject matter.
Figure 10C:
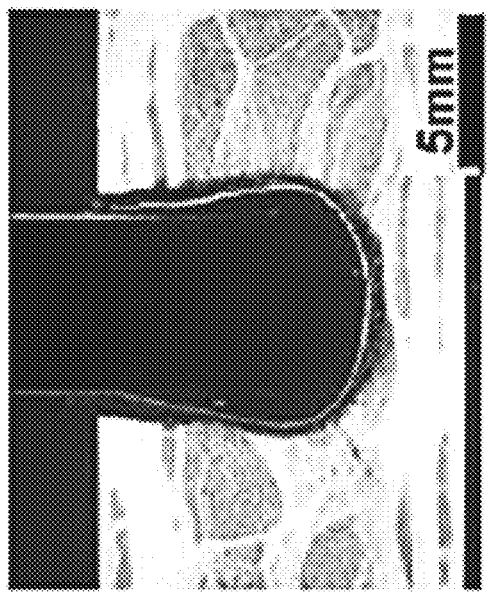
FIG. 10C illustrates another example representation of connection structure within the PCB, in accordance with another embodiment of the present subject matter.
Figure 10D:
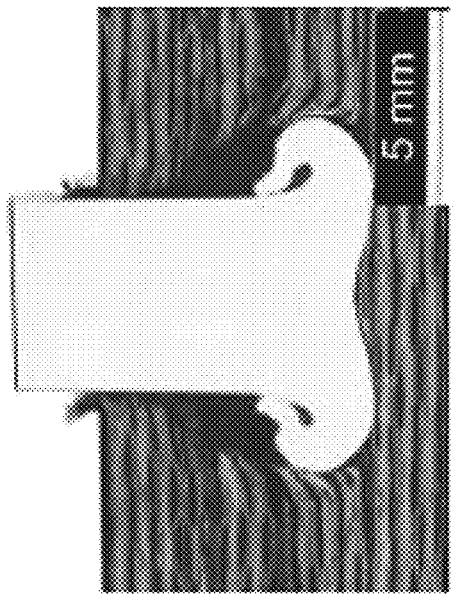
FIG. 10D illustrates another example representation of connection structure within the PCB, in accordance with another embodiment of the present subject matter.

| Figure | Material (Rivet) | Material (substrate) |
| --- | --- | --- |
| FIG. 10A | Ti. Gr. 2 | GF-PEI |
| FIG. 10B | AA 6056 | GF-PA6 |
| FIG. 10C | Ti-6Al-4V or TC4 | GF-P |
| FIG. 10D | Ti-6Al-4V or TC4 | CF-PEEK |

The connection structure 200 as illustrated by the present subject matter at-least leads to a lower cost due to avoiding of using press fit connection and improvement in quality by reducing stress on PCB. Moreover, the overall size of the present structure is reduced, thereby leading to a smaller footprint on the PCB. Furthermore, the present structure renders a possibility to integrate PCB and external conductor in one assembly step.

Overall, the present connection structure by at-least leading to achievement of a high current connection between bus bars or cables at-least avoids the demerits of press-fit connectors or other analogous connectors, such as stress development. By at-least appropriating the friction riveting process as a joining means, the present connection structure may be developed by short joining cycles (0.5 to 12 s) and no surface-preparation or pre-treatment is required with respect to the PCB. Moreover, the present connection structure achieves a single side joint availability, akin to surface mounted devices (SMDs). Accordingly, necessity of a bottom insulation layer and additional coating otherwise needed in conventional wiring substrates is not anymore required.

Terms used in this disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description of embodiments, claims, or drawings, should be understood to contemplate the possibilities of including one of the terms, either of the terms or both terms. For example, the phrase "A or B" should be understood to include the possibilities of "A" or "B" or "A and B."

All examples and conditional language recited in this disclosure are intended for pedagogical objects to aid the reader in understanding the invention and the concepts contributed by the inventor to furthering the art and are to be construed as being without limitation to such specifically recited examples and conditions. Although embodiments of the present disclosure have been described in detail, it should be understood that various changes, substitutions, and alterations could be made thereto without departing from the spirit and scope of the present disclosure.

The invention claimed is:

1. A structure for electrically connecting an external conductor, said structure comprising: a wiring substrate comprising a stack based arrangement of a plurality of layers, said layers defined as electrically conducting layers and insulating layer; and a rivet supported from the wiring substrate, said rivet comprising: a) an embedded portion within the wiring substrate, wherein said embedded-portion comprises: an upper section extending through the stack of the plurality of layers; and a bottom section extending laterally with reference to the upper section; and b) a portion protruding from wiring substrate for receiving an external conductor and thereby electrically connecting with the wiring substrate, wherein the wiring substrate is a printed circuit substrate (PCB) composed of a pattern of dielectric layers and copper layers; and wherein the bottom section is embedded within the insulating layer of the wiring substrate, the insulating layer corresponding to a non-conducting substrate of the PCB.

2. The structure as claimed in claim 1, wherein said external conductor is a high-current carrying conductor comprising at least one of: a bus bar shaped to be connected with the rivet; and a power-cable having a crimp connector.

3. The structure as claimed in claim 1, wherein the protruding portion of the rivet acts as a terminal-post to connect the external conductors with the wiring substrate.

4. The structure as claimed in claim 1, wherein the rivet is embedded within the wiring substrate through the friction riveting process.

5. The structure as claimed in claim 1, wherein the bottom section is anchored within the wiring substrate in a positive-locking manner.

6. The structure as claimed in claim 4, wherein the bottom section of the rivet is laterally extended with respect to the upper section owing to plasticization and deformation underwent by the bottom section during the friction riveting process.

7. The structure as claimed in claim 1, wherein the laterally extended bottom section corresponds to an arched configuration defining a diameter, said diameter of arched configuration being greater than a diameter of the upper section.

8. The structure as claimed in claim 1, further comprising a supporting-substrate providing a base for supporting the wiring substrate.

9. The structure as claimed in claim 8, wherein the supporting substrate receives the bottom section of the rivet for assisting the embedding of the rivet within the wiring substrate.

10. The structure as claimed in claim 1, further comprising: a fastener for rigidly holding the external conductor to the protruding portion of rivet.

11. A structure for electrically connecting an external conductor, said structure comprising: a wiring substrate comprising a stack based arrangement of a plurality of layers, said layers defined by electrically conducting layer and insulating layers; at least one rivet embedded within the wiring substrate, said rivet comprising an upper section extending through the stack of the plurality of layers, and a bottom section extending laterally within the wiring substrate with reference to the upper section; and a metallic-post vertically extending from the upper section of the rivet for receiving an external conductor and thereby electrically connecting the conductor with the wiring substrate via the rivet, wherein the wiring substrate is a printed circuit substrate (PCB) composed of a pattern of dielectric layers and copper layers; and wherein the bottom section is embedded within the insulating layer of the wiring substrate, the insulating layer corresponding to a non-conducting substrate of the PCB.

12. The structure as claimed in claim 11, wherein the metallic post is vertically connected to a segment of the rivet protruding from the wiring substrate to define an electrical connection with the rivet, said connection being at least one of a welded or soldered connection.

13. The structure as claimed in claim 11, wherein the metallic post is vertically connected to a segment of the rivet sitting flush the wiring substrate to define an electrical connection with the rivet, said connection being at least one of a welded or soldered connection.

14. The structure as claimed in claim 11, wherein the rivet is embedded within the wiring substrate through the friction riveting process.

15. The structure as claimed in claim 11, wherein the bottom section is anchored within the wiring substrate in a positive-locking manner.

16. The structure as claimed in claim 15, wherein the bottom section of the rivet is laterally extended with respect to the upper section owing to plasticization and deformation underwent by the bottom section during the friction riveting process.

* * * * *